United States Patent [19]
Eckersley et al.

[11] Patent Number: 5,332,946
[45] Date of Patent: Jul. 26, 1994

[54] ELECTROLUMINESCENT LAMP WITH NOVEL EDGE ISOLATION

[75] Inventors: Rodney T. Eckersley, Tempe; Will M. Hooke, Phoenix; Sharlyn R. Stocker, Mesa; Ralph McGuigan, Tempe, all of Ariz.

[73] Assignee: Durel Corporation, Tempe, Ariz.

[21] Appl. No.: 903,600

[22] Filed: Jun. 24, 1992

Related U.S. Application Data

[63] Continuation-in-part of Ser. No. 720,224, Jun. 24, 1991, abandoned.

[51] Int. Cl.$^5$ ............................................. H05B 33/00
[52] U.S. Cl. .................................. 313/506; 313/509; 313/511; 428/690
[58] Field of Search ............... 313/506, 509, 511, 512, 313/496; 428/690

[56] References Cited

U.S. PATENT DOCUMENTS

| | | | |
|---|---|---|---|
| 2,928,974 | 3/1980 | Mash | 313/108 |
| 2,944,177 | 7/1960 | Piper | 313/108 |
| 3,110,836 | 11/1963 | Blazek et al. | 313/108 |
| 3,110,837 | 11/1963 | Wollentin | 313/108 |
| 3,114,853 | 12/1963 | Bouchard | 313/108 |
| 3,148,299 | 9/1964 | Devol et al. | 313/108 |
| 3,315,111 | 4/1967 | Jaffe et al. | 313/108 |
| 3,497,750 | 2/1970 | Knochel et al. | 313/108 |
| 3,519,871 | 7/1970 | Kanie | 313/108 |
| 3,895,208 | 7/1975 | Kraus | 219/68 |
| 4,097,776 | 6/1978 | Allinikov | 313/502 |
| 4,425,496 | 1/1984 | Le Fur et al. | 219/384 |
| 4,455,324 | 6/1984 | Kamijo et al. | 427/66 |
| 4,534,743 | 8/1985 | D'Onofrio et al. | 445/24 |
| 4,614,668 | 9/1986 | Topp et al. | 427/66 |
| 4,626,742 | 12/1986 | Mental | 313/503 |
| 4,647,337 | 3/1987 | Simopoulos et al. | 156/633 |
| 4,665,342 | 5/1987 | Topp et al. | 313/505 |
| 4,684,353 | 8/1987 | deSouza | 445/51 |
| 4,856,392 | 8/1989 | Appelberg | 83/40 |
| 4,904,901 | 2/1990 | Simopoulos et al. | 313/509 |

FOREIGN PATENT DOCUMENTS

| | | | |
|---|---|---|---|
| 3541950 | 6/1986 | Fed. Rep. of Germany | 313/512 |
| 3638858 | 5/1987 | Fed. Rep. of Germany | 313/512 |
| 0277438 | 11/1964 | Netherlands | 313/506 |

OTHER PUBLICATIONS

Luminescent Systems, Inc., "Electroluminescence", 1983.

Banovec et al., "Pulsed Laser Etching of Indium Tin Oxide Thin Films", Austrian Hungarian-Yugoslav Fourth Joint Vacuum Conference Sep. 20–23, 1988, Portoroz, Slovenia, Yugoslavia.

Primary Examiner—Donald J. Yusko
Assistant Examiner—Nimesh Patel
Attorney, Agent, or Firm—Fish & Richardson

[57] ABSTRACT

An electroluminescent sheet-form lamp with a main portion of a conductive layer isolated from an edge region susceptible to detrimental conductive pathways by isolation provided along at least a portion of the perimeter of the lamp as a result of removal of a preapplied conductive coating such that, at the region of the isolation, the main portion of the one conductive layer which forms the respective electrode commences at a line spaced inwardly from the outer edge of the lamp. The preapplied conductive coating material may be removed to form a line of interruption that leaves in place a narrow margin of conductive coating in the edge region which is electrically isolated from the main portion of the coating forming the first electrode. The lamp may be formed by exposing preselected portions of the preapplied conductive coating to laser radiation sufficient to remove the preselected portions and form the region of isolation. A scribing technique or a mask, which may be a printed functional layer of the lamp, are employed.

28 Claims, 7 Drawing Sheets

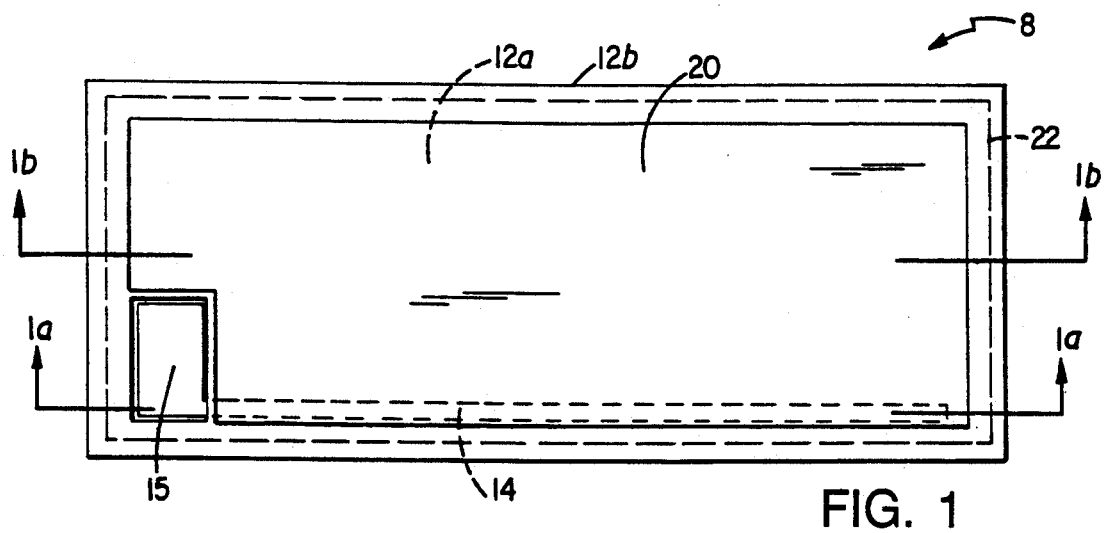
FIG. 1
FIG. 1a
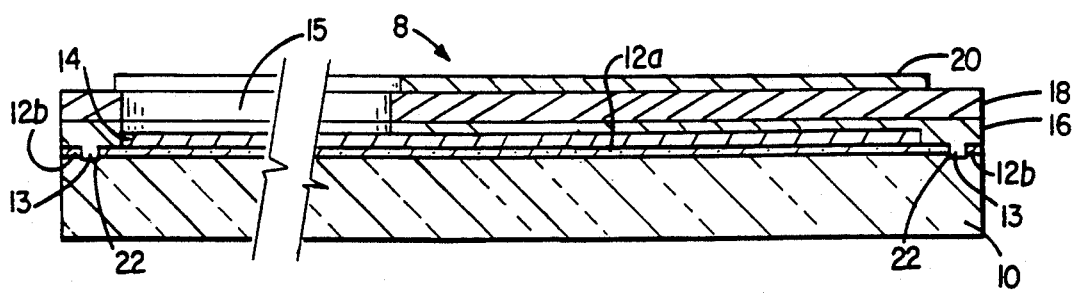
FIG. 1b
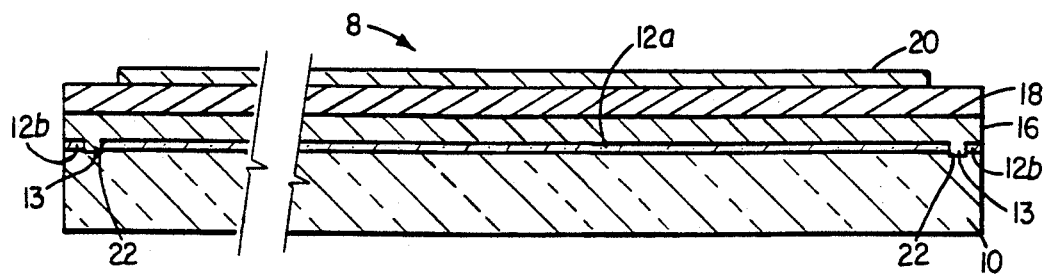
FIG. 1c
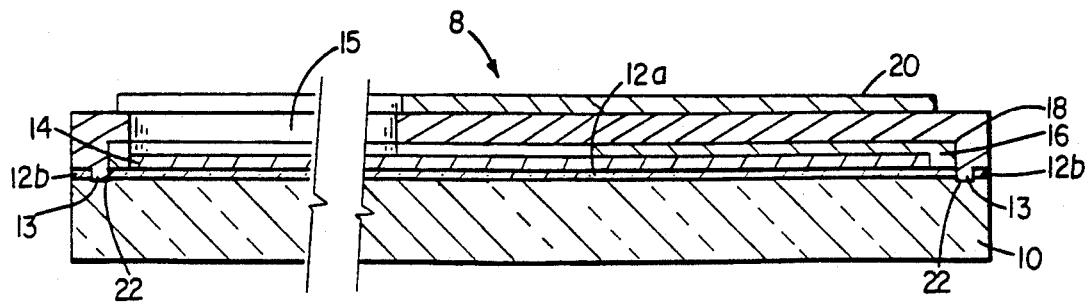

ELECTROLUMINESCENT LAMP WITH NOVEL EDGE ISOLATION

CROSS-REFERENCE TO RELATED APPLICATIONS

This application is a continuation-in-part of pending application U.S. Ser. No. 07/720,224, filed Jun. 24, 1991, entitled "Electroluminescent Lamp" by Eckersley et al. being abandoned upon the filing of this application.

BACKGROUND OF THE INVENTION

Electroluminescent lamps are typically formed as sandwiches of a number of layers, including a transparent substrate, a transparent front electrode, a phosphor layer, a dielectric layer, and a rear electrode. Other layers are often included. When electrical current is applied to the two electrodes, the phosphor layer emits light, the color of which is selectable depending, e.g., upon choice of the phosphors, use of filters, etc. Such lamps are suitable for many uses, one example being backlighting of automobile dashboards. Cost of such lamps is often a significant factor in their suitability for an application. Many applications also require the lamps to withstand high humidity conditions and meet other rigorous environmental or safety standards. It is common to form electroluminscent lamps by application of a general coating of conductive material on a large substrate panel, as by sputter coating, the coating providing the material for one of the electrodes, upon which the further layers are applied. Multiple EL lamps are then cut from the panel. It is known to protect the lamp from deleterious effects of moisture by encapsulating the entire cut-out lamp in a plastic film such as Aclar ®, or by encapsulating the lamp in Aclar and laminating the Aclar to itself using a thermoplastic adhesive material applied to the Aclar, both of which are steps that add to the expense of the lamp. This protection also serves to prevent electrical shorting between the two electrodes or failure at the edges of the lamp as well as eliminating shock hazards. It is also known to use in such lamps phosphor particles that have been individually encapsulated for protection against environmental conditions, but general encapsulation of the lamps has still been required or, if not generally encapsulated, the lamps have had drawbacks with respect to life expectancy, safety, etc.

SUMMARY OF THE INVENTION

We have discovered that, when making an electroluminescent lamp using a generally coated substrate panel to form an electrode, by providing an isolation line in the general conductive coating to isolate the main portion of the conductive coating that defines the electrode from the edge of the lamp, e.g., by a laser scribed line, structural durability, longer life expectancy, and avoidance of short circuiting and shock can all be achieved.

As referred to herein, "laser scribing" includes using numerical control machines, e.g., a laser and a movable table, to form the line by moving the laser and a panel of lamps on the table or by projecting a laser beam through a mask to form the line. Scribing an electrode layer in an EL lamp to deactivate one or more of its edges enables the lamp to be employed with completely bare edges in harsh environmental conditions. Such a lamp is less susceptible to electrical shorting between the two electrodes due to moisture making contact with the lamp at its edges, the occurrence of dendritic failure, i.e., darkened branching starting at the edges of the lamp caused by electro-chemical reactions within the lamp upon contact with moisture at the edges, and shock hazards due to an electrically energized layer being exposed at the edges of the lamp. A lamp with such deactivated and exposed edges is less expensive to produce and more flexible because it need not be encapsulated in a plastic film, and can have a greater life span than previously known lamps which are not encapsulated in film. An isolated margin of conductive coating, if left in the edge region, can provide advantages, including adherence properties that match those of the main body of the coating, which can assure good adherence and structural integrity with the subsequent coatings.

In a first aspect, the invention features, an electroluminescent sheet-form lamp having a transparent insulation layer, a transparent first conductive layer below the insulation layer forming a first electrode, a layer of phosphor material below the first conductive layer, a layer of dielectric material below the phosphor layer, a second conductive layer below the dielectric layer forming a second electrode, and electrical connection means for applying an electrical potential between the conductive layers to cause the phosphor to transmit light through the transparent conductive layer and the transparent insulation layer, one of the conductive layers having been formed as a general conductive coating preapplied over a panel of larger dimension than the lamp, from which the lamp has been cut. An edge region of the lamp is susceptible to formation of a detrimental, electrically conductive path. The improvement is that a main portion of the one conductive layer is isolated from the susceptible edge region by isolation provided along at least a portion of the perimeter of the lamp as a result of removal of the preapplied conductive coating such that, at the region of the isolation, the main portion of the one conductive layer which forms the respective electrode commences at a line spaced inwardly from the outer edge of the lamp. The lamp is the product of the process of exposing preselected portions of the preapplied conductive coating to laser radiation sufficient to remove the preselected portions and form the isolation, making the electrical connection for the one conductive layer to the main portion of the one conductive coating in a manner so that the electrical connection is electrically isolated from the susceptible edge region, and cutting the lamp from the panel of larger dimension to provide a lamp for which the formation of the conductive path in the edge region does not cause an adverse effect.

Embodiments described herein may also have one or more of the following features. The electroluminescent lamp is formed by providing the laser radiation in the form of a beam of greater dimension than the preselected portions of the preapplied conductive layer, and providing a mask between a source of the radiation and the preapplied conductive layer, the mask having aperture regions for exposing only the preselected portions of the preapplied conductive layer. The mask is a printed mask layer printed over the preapplied conductive coating to expose only the preselected portions to be removed. The electroluminescent lamp is formed by a process that includes selecting a laser that removes the preapplied conductive coating without removing all of the printed mask layer, the printed mask layer adapted to serve as a functional layer of the lamp. The electroluminescent lamp is formed by a process that includes selecting a laser that removes at least part of the printed mask layer along with the preapplied conductive coating. The lamp is formed by a process that includes preselecting the thickness of the mask layer relative to the thickness of the preapplied conductive coating to remove only some of the thickness of the mask layer while forming the region of isolation by removing all of the preapplied conductive coating in the preselected regions, the remaining portion of the printed mask layer adapted to serve as a functional layer of the lamp. The printed mask layer is a phosphor layer applied directly to the preapplied conductive coating. The printed mask layer includes the phosphor layer and at least a portion of a layer forming the electrical connection to the preapplied conductive coating. The laser radiation is provided by an excimer laser. The laser radiation is provided by a TEA laser. The mask is a separate member positioned above the preapplied conductive coating and the laser radiation is provided by an excimer or TEA laser. The beam is of fan shape, with a cross-section of elongated form, and means are employed to produce relative motion of the conductive coating and the beam in the direction transverse to the direction of elongation of the profile. The laser radiation is formed by a spot beam, wherein relative motion of the preapplied coating removes the preselected portions of the preapplied coating and the laser radiation is provided by a $CO_2$, TEA or excimer laser. The preapplied conductive coating material has been removed by the exposure to laser radiation to form a line of interruption that leaves in place a narrow margin of conductive coating in the edge region which is electrically isolated from the main portion of the coating forming the first electrode.

In another particular aspect, the invention features an electroluminescent sheet-form lamp having a transparent insulation layer, a transparent first conductive layer below the insulation layer forming a first electrode, a layer of phosphor material below the first conductive layer, a layer of dielectric material below the phosphor layer, a second conductive layer below the dielectric layer forming a second electrode, and electrical connection means for applying an electrical potential between the conductive layers to cause the phosphor to transmit light through the transparent conductive layer and the transparent insulation layer, one of the conductive layers having been formed as a general conductive coating preapplied over a panel of larger dimension than the lamp, from which the lamp has been cut. An edge region of the lamp susceptible to formation of a detrimental, electrically conductive path. The improvement is that a main portion of the one conductive layer is isolated from the susceptible edge region by isolation provided along at least a portion of the perimeter of the lamp as a result of removal of the preapplied conductive coating such that, at the region of the isolation, the main portion of the one conductive layer which forms the respective electrode commences at a line spaced inwardly from the outer edge of the lamp, the electrical connection for the one conductive layer is made to the main portion of the one conductive coating while being electrically isolated from the susceptible edge region; the lamp is formed by cutting its outline from the panel of larger dimension to provide a lamp for which the formation of the conductive path in the edge region does not cause an adverse effect; and the preapplied conductive coating material is removed in a manner to form a line of interruption that leaves in place a narrow margin of conductive coating in the edge region which is electrically isolated from the main portion of the coating forming the first electrode.

Embodiments described herein may also include one or more of the following features. The one conductive layer is the transparent first conductive layer forming the first electrode. There is an insulating substrate below the second conductive coating and the one conductive layer is the second conductive layer forming the second electrode, preapplied to the insulating substrate. The phosphor material includes encapsulated phosphor particles and the edge region is provided as a bare edge resulting from cutting of the lamp from the larger panel. The lamp is mounted in a manner that exposes the bare edge region to contact by a person, the isolation preventing a shock hazard to the person. The lamp is mounted in a manner that allows moisture to reach the bare edge region of the lamp, the isolation preventing electrical current leak through the moisture that could lead to degradation of the lamp structure.

In another aspect, the invention features an electroluminescent sheet-form lamp having a transparent substrate layer, and, in successive relationship, a transparent first conductive layer forming a first electrode, a layer of phosphor material comprising encapsulated phosphor particles, a layer of dielectric material, a second conductive layer forming a second electrode, and electrical connection means for applying an electrical potential between the conductive layers to cause the phosphor to transmit light through the transparent conductive layer and the transparent substrate, the first transparent conductive layer comprising a preapplied continuous transparent coating over the substrate, outer edges of the layers defining the lamp being exposed to the ambient environment and being susceptible to formation of a detrimental conductive path. The improvement is a line of interruption provided along at least a portion of the perimeter of the lamp as a result of removal of a line of the preapplied transparent conductive coating. The line of interruption is spaced inwardly from the outer edges of the first conductive layer and electrically isolates a main, inner portion of the first transparent layer from a margin portion of the conductive layer adjacent to the edge of the lamp. The electrical connection for the transparent conductive layer is connected to the main inner portion, the main portion serving as the first electrode which is electrically isolated from the margin portion of the first conductive layer. The isolation of the main portion provides a lamp for which the formation of the conductive path in the edge region does not cause an adverse effect.

Embodiments described herein may also include one or more of the following features. The line of interruption is formed by laser scribing the preapplied conductive layer. The transparent conductive layer comprises indium tin oxide. The phosphor material is doped zinc sulfide. The substrate layer is formed of polyester. An insulation layer is provided on the back of the second conductive layer.

In another aspect, the invention is a method of forming an electroluminescent sheet-form lamp having a predetermined edge configuration that may correspond to a custom order or a complex shape. The method incudes providing a sheet-form laminate member larger than the lamp, the laminate member comprising a transparent substrate layer, a transparent first conductive layer over the substrate layer, a layer of phosphor material over the first electrode layer, a layer of dielectric material over the phosphor layer, and a second conductive layer over the dielectric layer, cutting the lamp from the larger laminate member along predetermined lines conforming to the predetermined edge configuration, and forming electrical connections for applying electrical potential between the conductive layers to cause the phosphor to transmit light through the conductive layer and the transparent substrate. The improvement is that during formation of the laminate member, the first transparent electrode is formed by first providing the first transparent conductive layer as a continuous layer on a substrate corresponding to the size of the larger laminate member and subsequently forming a line of interruption in the layer as a result of removal of a line of the conductive coating within the predetermined edge configuration of the desired lamp. The line of interruption extends about the area of the lamp and spaced inwardly from the location of the predetermined edge configuration. The line of interruption electrically separates a main, inner portion of the first conductive layer, to serve as a first electrode, from an electrically isolated margin portion of the first conductive layer adjacent to the predetermined edge configuration. After completion of formation of the laminate member, the lamp is cut from the laminate member to the predetermined edge configuration, leaving exposed cut edges susceptible to formation of a detrimental electrically conductive path. Electrical connections are formed including forming an electrical connection to the inner portion of the first conductive layer that serves as the first electrode, while maintaining electrical isolation from the margin portion of the first conductive layer. The isolation of the main portion provides a lamp for which the formation of the conductive path at the cut edges does not cause an adverse effect.

Various embodiments may also include the following. The line of interruption is formed by exposing preselected portions of the preapplied conductive coating to laser radiation sufficient to remove the preselected portions and thus form the electrically isolated margin portions.

The invention also includes further methods for manufacture and use of the lamps described below. Still further advantages and features of the invention will also become apparent from examination of the drawings and the detailed description below.

DRAWINGS

FIG. 1 is a plan view of an electroluminescent lamp according to the invention showing perimeter isolation about the outer edges of the lamp which deactivates the edges of the lamp.

FIG. 1a is a cross-sectional view of the lamp taken along line 1a of FIG. 1, i.e., through the bus bar, showing the various layers of the lamp.

FIG. 1b is a cross-sectional view of the lamp taken along line 1b of FIG. 1, showing the various layers of the lamp at a position spaced from the bus bar.

FIG. 1c is a cross-sectional view similar to FIG. 1a of an alternative embodiment of the lamp.

FIGS. 10-10b illustrate forming electroluminescent lamps of the invention, wherein FIG. 10 is a partial top view of a substrate coated to form a mask layer, FIG. 10b is a perspective view illustrating the substrate after exposure to radiation.

DETAILED DESCRIPTION

Figure 2:
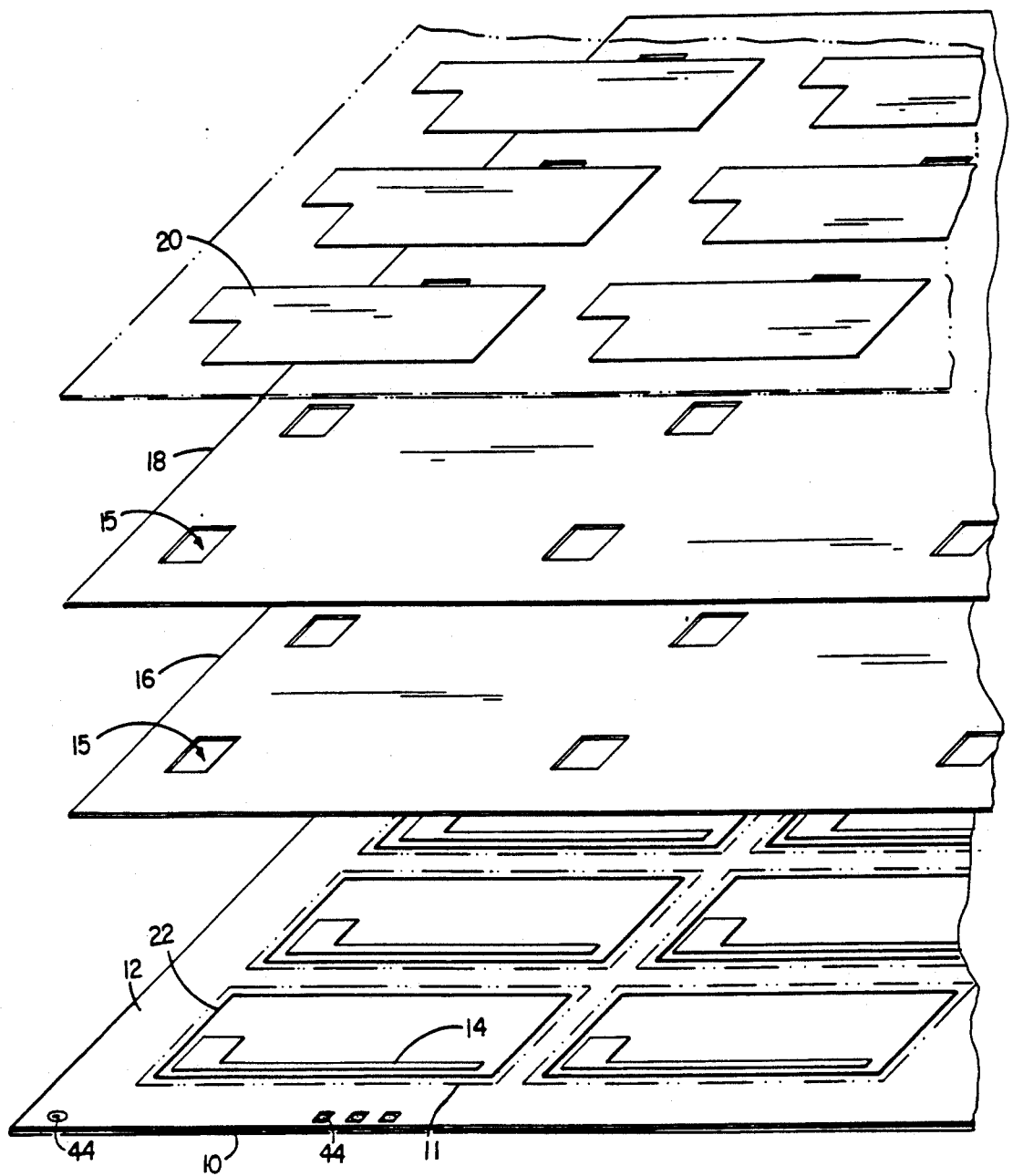
FIG. 2 is an exploded view of a panel of lamps including the lamp of FIGS. 1, 1a and 1b showing layers of a panel as separate elements.
Figure 7:
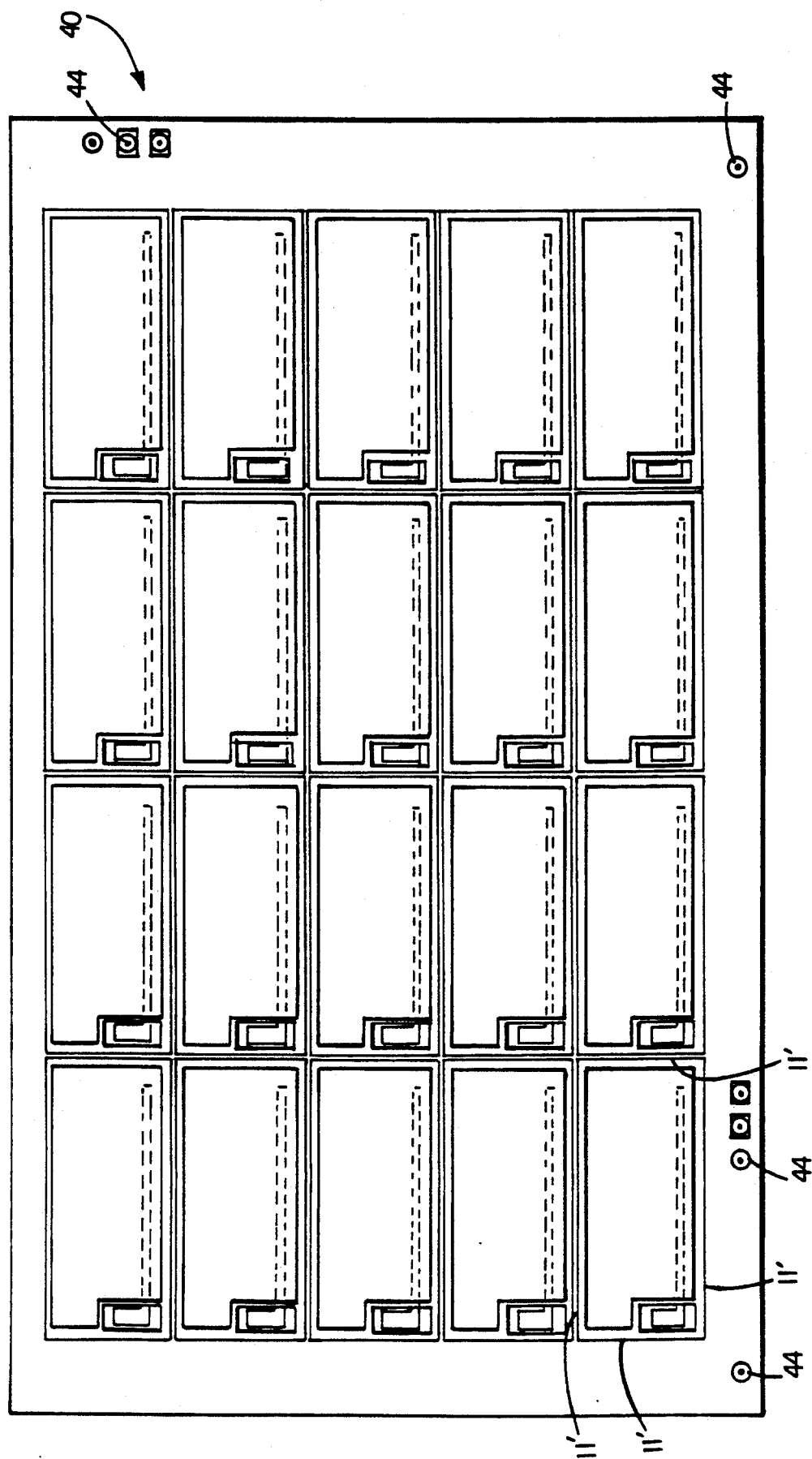
FIG. 7 is a plan view of a panel of lamps which are manufactured simultaneously.

Referring to FIG. 1, there is shown a top view of an electroluminescent lamp 8 after it is cut with other such lamps from a panel (see FIGS. 2 and 7). The panel comprises a clear substrate carrying a preapplied, general coating of a transparent conductor, on which the remaining layers have been deposited to comprise the lamp.

The edges of the lamp, according to the invention, are bare, i.e. unencapsulated, but nevertheless prevent various electrical and structural failure and shock hazard.

As shown in the cross-sectional and exploded views of FIGS. 1a, 1b and 2, the lamp 8 includes a number of layers beginning with a transparent substrate 10, e.g., a sheet of polyester film, having a thickness of approximately 0.007 inches. In manufacture, the lamp 8 along with other lamps as shown in FIGS. 2 and 7 are formed simultaneously by successive formation of the layers upon a panel of this substrate. Each lamp 8 is to be cut, as described below, along the dashed and dotted lines 11 in FIG. 2 (along the solid lines 11' in FIG. 7).

The substrate 10 has on one side a preapplied, general coating of a transparent conductive material, preferably, indium tin oxide (ITO), although aluminum oxide, gold, and silver, or other composite coatings may also be used. The ITO material is, preferably, vacuum sputtered onto a 48 inch web which is slit to narrower panel widths to provide a general ITO coating that extends over the entire substrate panel, i.e., to the edges of the panel, to form a transparent front coating 12 that is approximately 1000 Å thick. Sputter coating is preferred because it provides high conductivity as well as high optical transmission of light through the front coating 12.

For each lamp location on the panel, there is first deposited an optional bus bar 14 used to distribute power across the front of the lamp 8 when an electrical lead is attached to the bus bar by a connector. The bus bar 14 is formed by screen printing a conductive ink, e.g., silver flakes dispersed in a polymeric resin carrier dissolved in a suitable solvent, and printed as a layer approximately 0.0005 inches thick. The bus bar 14 is deposited within the outline 11 of the lamp 8 and within and spaced from a line of interruption 22 to be formed in the front conductive coating 12 (as described below). The solvent in the ink is then volatilized by placing the panel in an oven to remove the solvent and leave behind solid resin and silver which forms the bus bar 14.

Next, for each lamp, a line of interruption 22 is formed in the conductive coating 12 using a laser, e.g., by laser scribing the ITO layer with a laser having a focused spot beam, with provisions for relative scan in the x and y directions of the panel relative to the laser. In an alternative embodiment (not shown), the ITO layer may be removed from the substrate 10 in the margin of the lamp 8, i.e., the area commencing at the line 22 and extending to the edge of the lamp. An advantage of the former technique, in which a line of conductive coating is removed, leaving adjacent portions of conductive coating isolated from each other, is that subsequent layers may be bonded predominantly to the remaining conductive material and only the small amount of the subsequent layers bridging the line from which the conductive material is removed is bonded directly to the substrate 10, which in some cases does not provide as secure a bond. (Further, it will be understood that a line of interruption can be formed prior to the printing of the bus bar.)

Laser scribing with a $CO_2$ laser is a preferred method of forming the line of interruption because of its ease of use and low cost. That is, the relative scanning of the laser upon the panel can be programmably controlled as described below in connection with FIG. 8, and does not require retooling screens and dies in order to change the pattern of the line 22. $CO_2$ lasers provide adequate processing capability at low capital and operating cost. Other techniques employing lasers are discussed below. (In addition, other methods may be used to scribe line 22, including mechanical abrasion, e.g., using a razor blade or abrasive pad to cut the ITO layer, water jet sprays, and chemical etching.)

In another embodiment of the present invention, an excimer laser is used to form the line 22. The excimer laser can operate so as to flood a laser beam through a mask positioned above and across the entire area of the panel. The flood beam ablates the ITO layer forming the front conductive coating 12 in the area of the line 22 to be scribed, but, by proper selection of wavelength of the laser, ablates little or none of the substrate 10. The mask may be formed by coating a quartz substrate with a metal and selectively removing, e.g., by imaging and then etching regions of the metal to form apertures in the metal in a desired pattern. Alternatively, the excimer laser beam can be directed through a hole in a mask to form a spot beam and the line 22 is then formed by moving the panel under the beam. One advantage of these approaches is that the substrate 10 can be thinner, thereby making the lamp 8 more flexible. In addition, a stronger lamp can result because the substrate 10 is not weakened in the area of the line 22 and is less likely to crack under stress. However, use of the excimer laser can entail a certain amount of retooling to create different masks for multiple line patterns.

In an important aspect of the invention, laser scribing the line 22 cuts a groove 13 (FIG. 1a) through the ITO layer of the front conductive coating 12 down to the substrate 10. The conductive coating 12 is thereby divided into a main, inner portion serving as the electrode 12a and a margin portion 12b which are electrically isolated from one another. Thus, an electrical lead attached to the bus bar 14 delivers power to the inner portion 12a of the front conductive coating only. The margin portion 12b is isolated, the edges of the conductive coating are deactivated, and the susceptibility to formation of a detrimental electrical conductive path is reduced. Examples of such a detrimental conductive path include paths caused by moisture at the exposed edges of the lamp 8 resulting in electrical failure of the lamp, or by a person's hand, for example, coming in contact with the edges resulting in electrical shock.

Because of the above described isolation, there is no need to encapsulate the entire lamp 8 in a plastic film (or, depending upon the barrier qualities of the preapplied coating, even to encapsulate the phosphor particles). As a result, the lamp 8 is less expensive to produce and more flexible and adaptable to specific applications than EL lamps encapsulated in film. In addition, the lamp 8 is more reliable in harsh environments, safer for use in consumer applications, and has a greater life span than previous non-encapsulated lamps.

Referring again to FIG. 1a, the width and depth of the groove 13 depend primarily on the selected spot size and power of the laser beam. In preferred embodiments, the width of the line 22 is between 0.005 and 0.010 inches, which is sufficient to prevent electrical arcing from the inner portion 12a of the front conductive coating 12 across the line 22 to the margin portion 12b under typical lamp operating conditions of 115 volts AC and 400 Hz. The line 22 may cut approximately 0.002 inches into the substrate 10 to ensure electrical separation between the inner portion 12a and the margin portion 12b of the coating. As shown in FIG. 1a, the resulting groove 13, if present, is then filled with material from one of the subsequent layers of the lamp 8 which are described below.

As shown in FIGS. 1a and 2, the front conductive coating 12, bus bar 14, and isolation line 22 are covered with a phosphor layer 16 formed of electroluminescent phosphor particles, e.g., zinc sulfide doped with copper or manganese, which are dispersed in a polymeric binder. Suitable binders include cyanoethyl cellulose, cyanoethyl pullulan, or polyvinylidene fluoride and its copolymers, all of which are commercially available. In cases where the barrier qualities of the successive layers are insufficient to prevent access of moisture through the thickness of the lamp to the phosphor particles, the phosphors employed can be of the encapsulated type in which each phosphor particle has its own protected outer coating that prevents entry of deleterious moisture. Such coatings include 72X, available from Sylvania/GTE, and coatings disclosed in U.S. Pat. No. 4,855,189 and in co-pending application Ser. No. 07/514,440, filed Apr. 25, 1990, which is incorporated herein by reference. The phosphor layer 16 is applied to the front conductive coating 12, e.g., by screen printing or other coating methods, and has a thickness of approximately 0.001 inches.

In the embodiment shown in FIG. 1a, the phosphor layer 16 extends over the inner electrode portion 12a and margin portion 12b of the front conductive coating 12, thereby filling in the groove 13 as shown in FIGS.

1a and 1b. But, in alternative embodiments, such as the one shown in FIG. 1c, the phosphor layer 16 is applied to the inner portion 12a only and stops short of the line 22 so that a subsequent layer of the lamp 8 fills in the groove 13. Nonetheless, in either embodiment, the phosphor layer 16 is applied so as to leave an exposed window 15 above a portion of the bus bar 14 to which a front lead connection can be attached.

The next layer of the lamp 8 is a dielectric layer 18 formed of a high dielectric constant material, e.g., barium titanate, dispersed in a polymeric binder such as one of those mentioned above. The dielectric layer 18 measures approximately 0.001 inches thick and is applied, e.g., screen printed, over the phosphor layer 16 so that it extends to the edges of the lamp 8 but leaves the area of window 15 uncovered. In the lamp of FIG. 1c where the phosphor layer 16 stops short of the line 22, material from the dielectric layer 18 fills the groove 13.

Deposited above the dielectric layer is a rear electrode 20, formed of conductive particles, e.g., silver, carbon, or nickel, dispersed in one of the polymeric binders mentioned above to form a screen printable ink. The ink is applied, e.g., screen printed, over the dielectric layer 16 to form the rear electrode 20 in a layer approximately 0.0005 inches thick. The rear electrode 20 terminates back from the edges of the lamp 8 between 0.010 and 0.050 inches, thereby reducing the possibility of shorting between the rear electrode and the front electrode.

Figure 6:
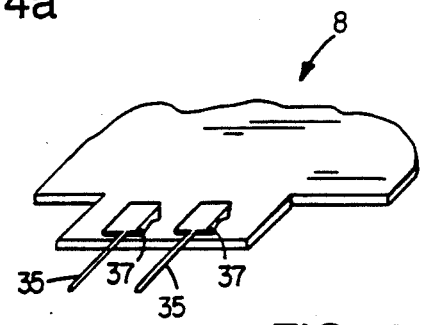
FIG. 6 is a view also similar to FIG. 4a of an alternative embodiment of the lamp showing the lamp with crimp style connectors.

Finally, in some applications of the lamp 8, an additional insulating layer (not shown) is applied over the rear electrode 20, e.g., to prevent possible shock hazards or to provide a moisture barrier to protect the phosphor particles. When included, the insulating layer may be screen printed over the rear electrode 20, or laminated as a preformed layer to the lamp using a pressure sensitive adhesive or similar means, or flood coated, etc. When applied as a preformed layer, the insulating layer can be a preformed film where an area of the film corresponding to the window 15 is cut and peeled away to allow an electrical connection to the front conductive coating 12. The area of the window 15 can be cut and removed by laser scribing after the film is applied over the rear electrode 20 (in much the same way as the front conductive coating 12 is laser scribed after it is applied to the substrate 10), or the area of the notch can be cut from the film before it is applied to the rear electrode. Alternatively, piercing connectors such as those shown in FIG. 6 can be used to pierce the insulation layer and make connection to the underlying conductive layer.

Figure 3:
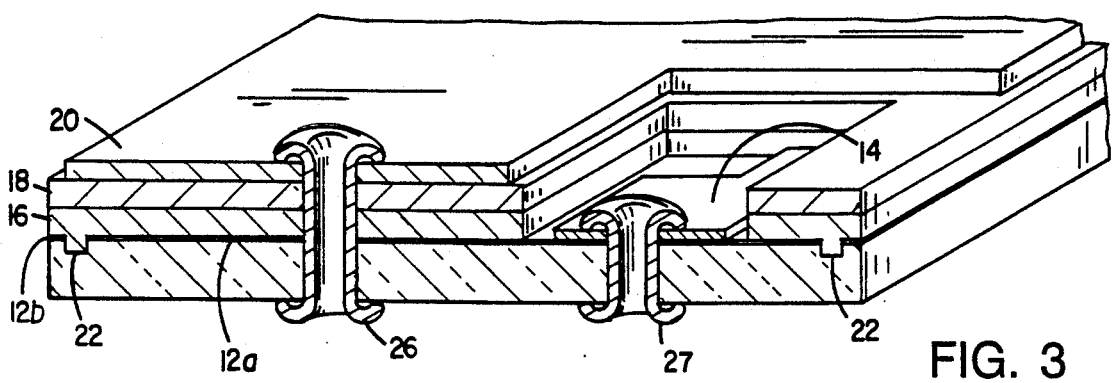
FIG. 3 is a cross-sectional isometric view of the lamp of FIG. 1 showing attachment of eyelet connectors.
Figure 4:
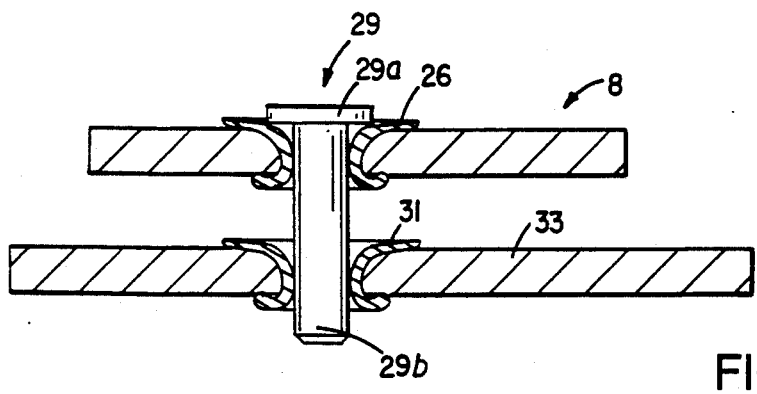
FIGS. 4 and 4a are a cross-sectional view and a perspective view, respectively, of the lamp of FIG. 3 showing the lamp attached to a printed circuit board by a pin and eyelet arrangement.
Figure 4A:
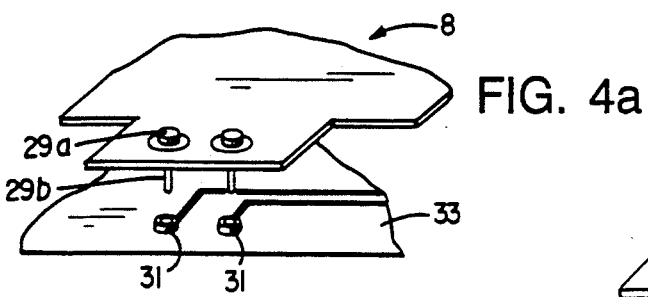

Electrical connectors are then applied to the bus bar 14 and the rear electrode 20 to connect electrical leads to the lamp 8. For example, in the embodiment of FIG. 3, eyelets 26 and 27 connect with and carry power to the rear and front electrodes 20 and 12. The eyelets 26 and 27 are typically brass or tin-plated brass barrels which are rolled over on each end. The eyelets 26 and 27 are inserted through holes which may be cut by the laser in the lamp 8 and are crimped in place to provide a secure electrical connection to the electrodes 12 and 20 of the lamp. FIGS. 4 and 4a show a conductive pin 29 having a head 29a and a shaft 29b which extends in a press fit through the eyelet 26 in the lamp 8 and into a socket 31 in a printed circuit board 33 to make a connection between the lamp and the board.

Figure 5:
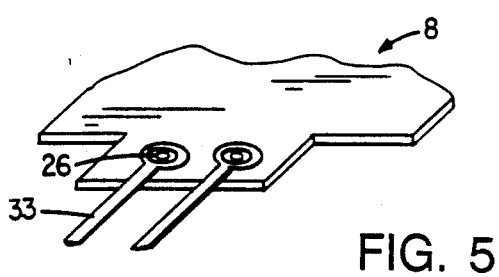
FIG. 5 is a view similar to FIG. 4a of an alternative embodiment of the lamp showing the lamp with solderable copper ribbon leads.

Referring to FIG. 5, copper ribbon leads 33 can be captured between the eyelets 26 and 27 of the lamp 8 to provide power to the electrodes 12 and 20. Alternatively, crimp-on termination connectors 35 (FIG. 6) may be used, e.g., pin crimp part #88997-2 distributed by AMP. The connectors 35 have fingers 37 which pierce the lamp and curl inwardly to clamp the connector in place.

Referring to FIG. 7, there is shown a panel 40 of lamps 8, each of which is essentially identical to the lamp 8 described above in connection with FIGS. 1, 1a, 1b and 2. Panel 40 measures approximately 12 by 15 inches and includes registration targets 44 along its outer edges. The registration targets 44 are applied, e.g., screen printed, onto the front conductive coating 12 on the panel 40 and may be punched out or cut by the laser or other means, to form registration points used subsequently by the laser and the screen printing devices to assure proper registration. The laser is typically mounted on a gantry that moves in one direction (X), while the lamp 8 is mounted on a table that moves in the other direction (Y), relative to the laser. Both the gantry and the table are numerical control (NC) machines, programmed to move in a coordinated manner and to turn the laser on and off at appropriate points to form the line 22. In this way, the NC machines, i.e., the laser and moveable table, move the panel relative to the laser to form the isolation line in each of the lamps 8 and upon completion of the sandwich to cut the panel 40, i.e., along lines 11', into individual lamps. In this way, the present invention permits a great degree of flexibility in the manufacture of lamps having complex shapes since the NC machines can be programmed to scribe the line at any desired offset margin from the shape of the lamp.

Figure 8:
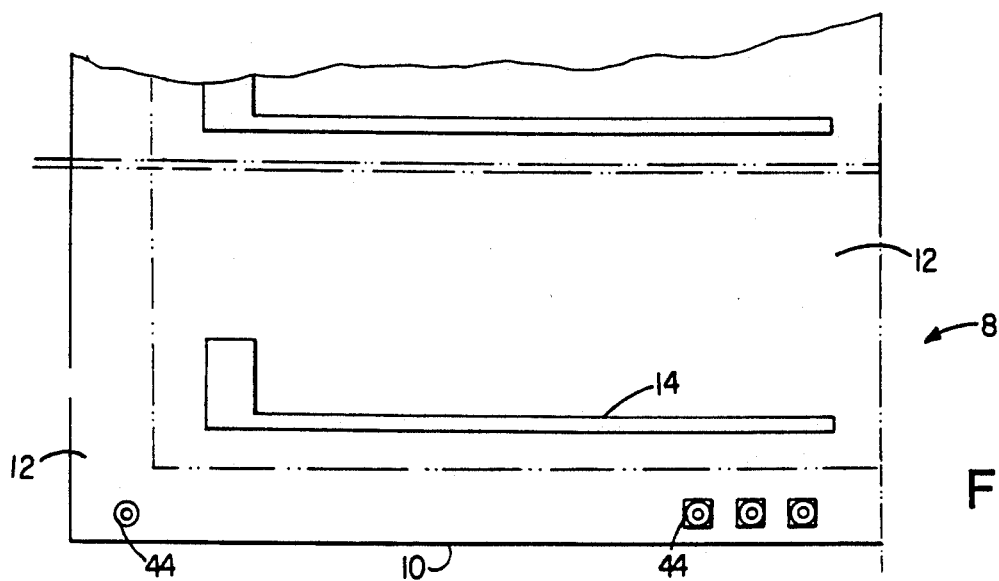
FIG. 8 is a view of a portion of the panel after a silver bus bar has been applied to the first electrode layer of a lamp.
Figure 8A:
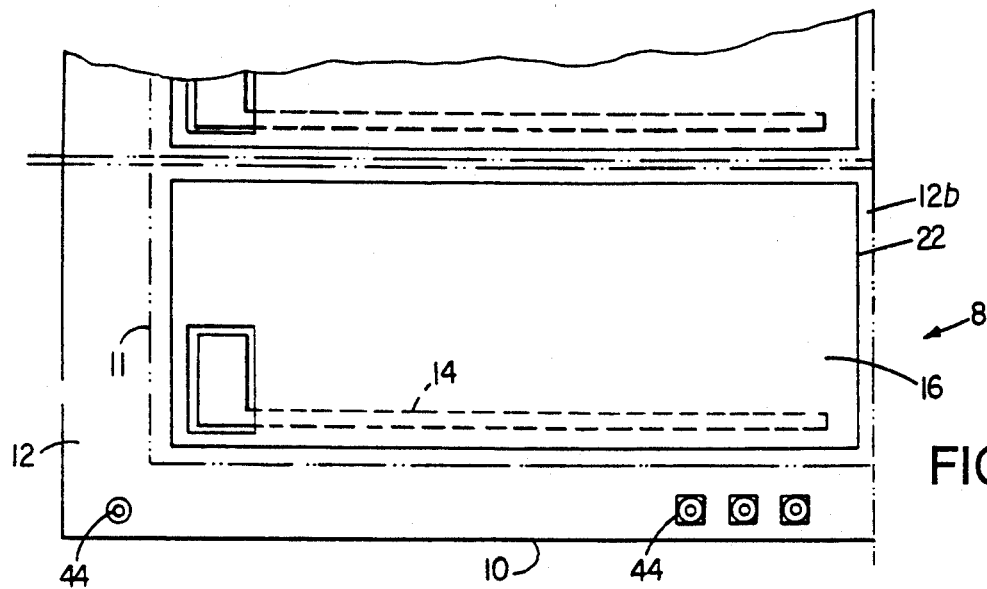
FIG. 8a is a view similar to that of FIG. 8 showing the lamp after the first electrode layer has been laser scribed to deactivate the edges of the electrode.
Figure 8B:
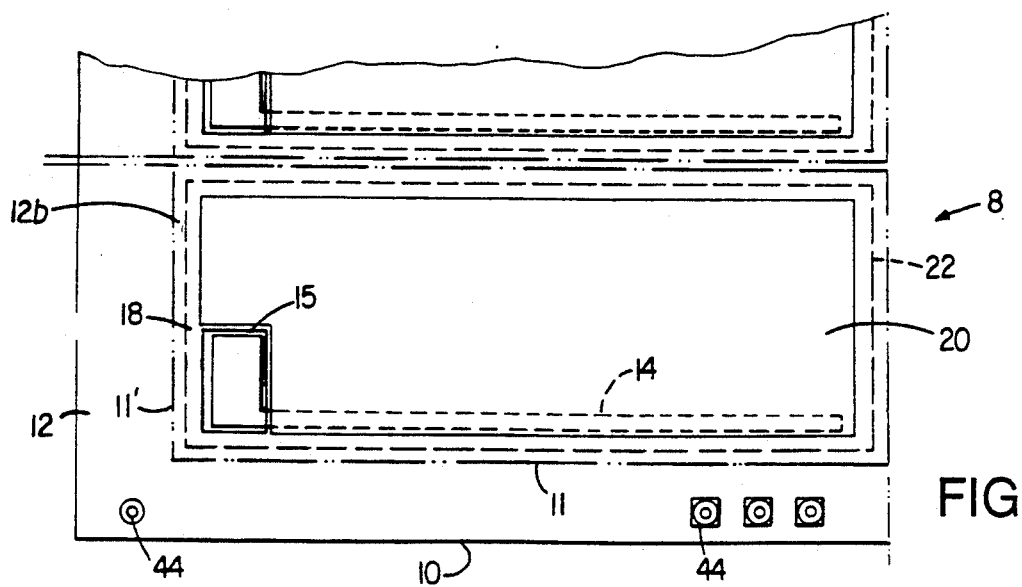
FIG. 8b is a view similar to FIG. 8a showing the portion of the panel after a phosphor layer has been applied over the first electrode layer and the laser scribed line.

Referring to FIGS. 8, 8a, and 8b, a single lamp 8 of the panel 40 is shown in various stages of construction. Substrate 10 which forms the first layer of the panel 40 is coated with a transparent conductive coating 12, e.g. ITO, as by sputter coating or flood coating. If the conductive coating 12 is applied by use of a solvent, the panel 40 is then placed in an oven and baked to remove solvents in the ITO material.

The bus bar 14 is then applied over the front conductive coating 12 of each lamp 8. Again, the entire panel 40 is placed in an oven to volatilize and remove any solvents used in forming the bus bar. After the bus bar 14 is applied, alignment pins on the movable table (not shown) are inserted through the registration targets 44, thereby allowing the NC machines to move the panel so that selected areas are positioned under the laser beam. Referring to FIG. 8a, the front conductive coating 12 is divided into an inner portion 12a and a margin portion 12b by laser scribing the line 22 about the perimeter of each lamp 8 and a coating of phosphor 16 is then applied. Referring to FIG. 8b, the remaining layers of dielectric 18 and rear electrode 20 are successively applied over the panel, leaving window 15 open on each lamp so that a lead attachment may be made to the front conductive coating 12 via the bus bar 14. Having thus formed each of the lamps 8 on the panel 40, the panel is repositioned on the table and the laser is used to cut each of the lamps 8 out of the panel 40, i.e., along lines 11'. Electrical leads are then attached to the front conductive coating 12 in the exposed area of the bus bar 14 and to the rear electrode 20.

Figure 9:
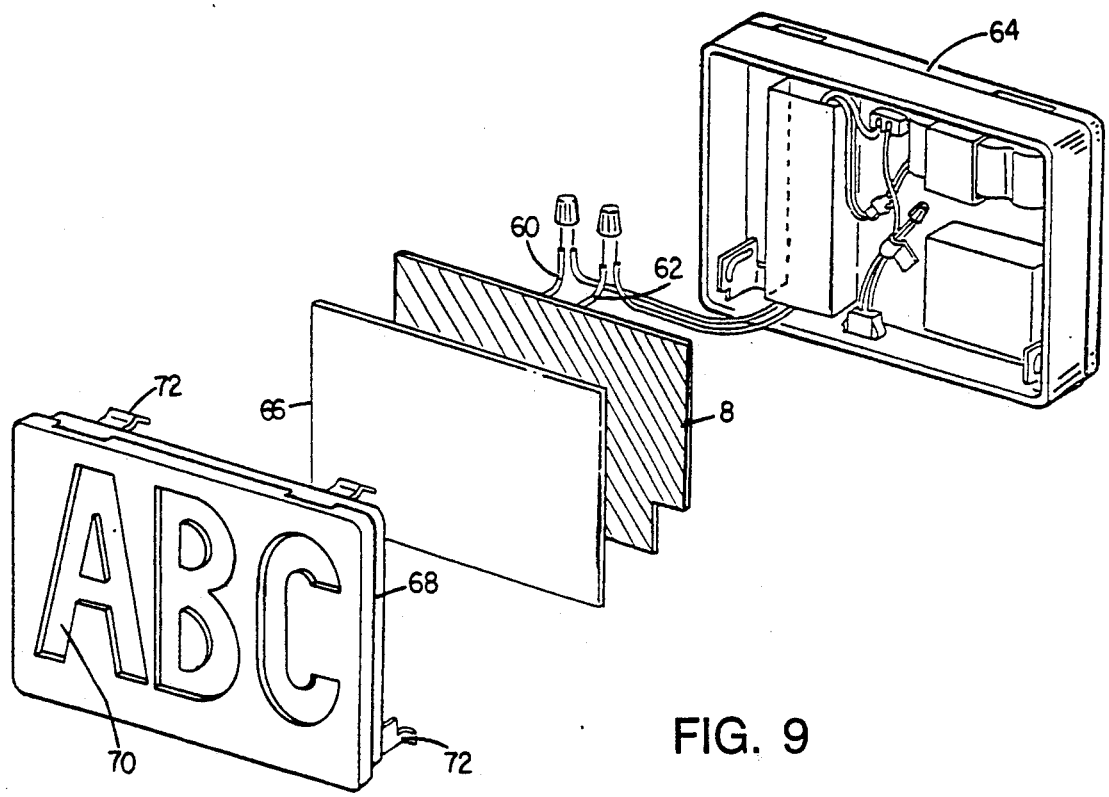
FIG. 9 is an exploded view of a sign employing the lamp of the present invention.

The finished lamp 8, with bare, unencapsulated edges, has many possible applications. Referring to FIG. 9, the EL lamp 8 is used to light a sign and is connected via conductive leads 60 and 62 to electronics which provide power to the lamp. The electronics are located in a plastic or metal housing 64 which can be hung on a wall. The lamp 8 fits within the housing 64 and is covered with a transparent sheet 66 which can be tinted in some preferred color, e.g., red, to alter the color of the light emitted through the sheet. Finally, a cover 68 having stenciled letters 70, i.e., "ABC", or graphics is fitted over the sheet 66 and the lamp 8 and connected to the housing 64 with clip members 72.

Because the edges of the lamp 8 have been deactivated by isolating an electrode as described above, the lamp can be mounted in the sign with a decreased chance of failure due to electrical shorting, e.g., if the lamp comes in contact with the housing of the sign or if the sign is exposed to moisture. In addition, the lamp 8 is safer for a person to handle, e.g., during assembly or repair of the sign.

Other embodiments of the lamp 8 are, of course, possible. For example, the line of interruption may be formed through multiple layers of the lamp, e.g., through the phosphor and ITO layers, rather than through the ITO layer alone. Furthermore, additional layers may be included in the lamp between the layers described above to accomplish specific effects. For example, an unfilled resin layer between the second conductive layer and the dielectric layer can be added to provide a better physical bond between the two layers. Layers may be included to provide vapor barrier effects.

In another embodiment (not shown), the lamp is formed from the rear electrode forward. That is, a first conductive coating, which may be transparent or non-transparent, is deposited, preferably by sputter coating as described above, over a substrate film and a line of interruption is formed in the coating to divide the coating into an inner portion forming the rear electrode and a margin portion electrically isolated from the main portion. Subsequently, a dielectric layer is deposited over the first conductive coating and fills the groove formed by the line of interruption. Phosphor material is deposited over the dielectric layer, and a transparent, conductive coating forming the front electrode is deposited over the phosphor layer so that it terminates back from the edges of the lamp between 0.010 and 0.050 inches. Finally, a clear, insulation coating may be applied to the front electrode to protect the electrode and prevent shock hazards. In an alternative embodiment of the lamp formed from the rear electrode forward, the substrate film and conductive coating may be separately prepared, laser scribed as described above, and laminated onto the remaining layers of phosphor, dielectric and front electrode to form the lamp.

Figure 10:
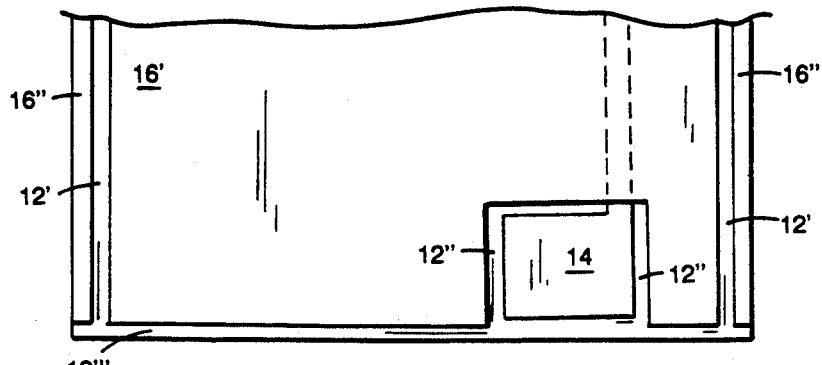
Figure 10A:
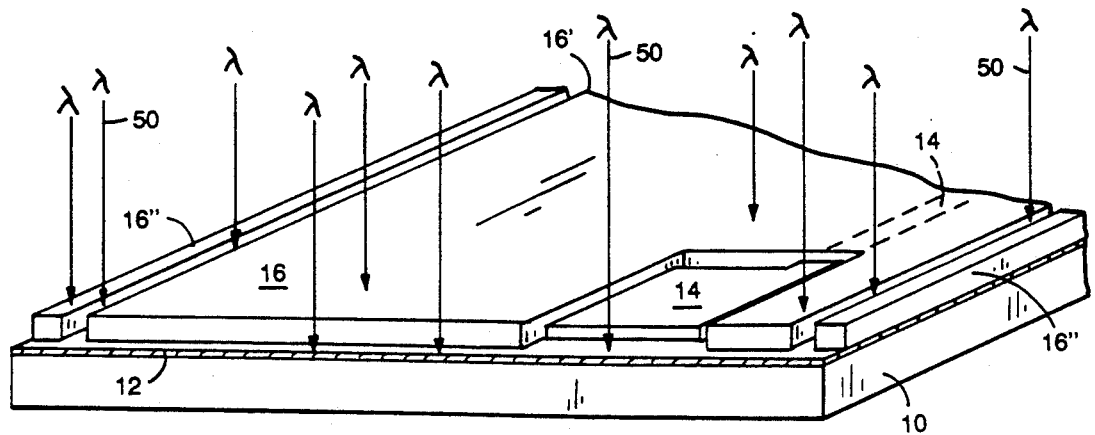
FIG. 10a is a perspective view of the substrate of FIG. 10, illustrating in addition, the application of radiation.
Figure 10B:
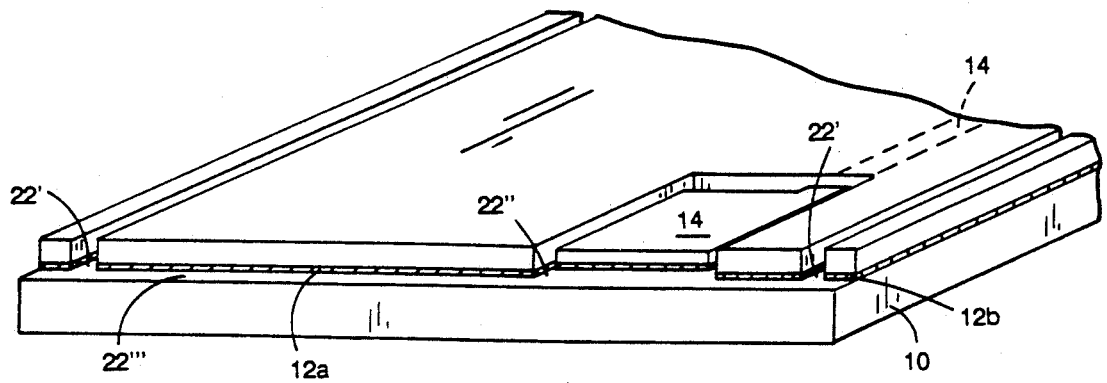

In various embodiments, the lines of interruption through the transparent conductive layer may be formed using laser radiation and other layers printed onto the lamp structure as a mask so as to expose and remove the transparent conductive material only from desired locations. For example, referring to FIGS. 10 to 10b, in a preferred embodiment, transparent substrate 10 (e.g., 0.007 inch polyester) is provided with transparent conductive layer 12 (e.g., 1000 A⁰ ITO), bus bar 14 (e.g., 0.0005 inch silver) and phosphor layer 16 (e.g., 0,001 inch 72X). The phosphor layer 16 is printed to form central region 16' and edge regions 16" which leave the transparent conductive material exposed at line regions 12' and 12" and along the margin region 12''' (FIG. 10 and 10a). To form lines of interruption, the structure is exposed to laser radiation (FIG. 10a). Those portions of the transparent conductive material 12', 12", 12''', which are directly exposed to the radiation are removed, forming interruption 22' between an inner portion 12a and margin portions 12b of the transparent conductive layer, interruption 22" around the bus bar 14 and an interruption 22''' (e.g. 0.050 inch in width), in which in this latter case, the transparent conductive material is removed to the margin of the substrate 10 (FIG. 10b). (It will be understood that material may be removed to the margin or leave margin portions as desired.) Those portions of the transparent conductive layer beneath the phosphor and bus bar masking layers, particularly importantly the portions to be energized when operating the lamp, are not affected by the radiation. After exposure, other layers such as a dielectric layer and a back electrode layer may be deposited as described hereinabove to form a desired lamp product. Connectors, such as crimp connectors, can be used as described above.

The laser radiation may be provided by an Excimer laser (e.g. wavelength 193, 308, 351 nm or most preferably 248 nm at 450 millijoules, 39 HZ) with an expanded (fan) beam (e.g. 9 inch by 0.25 inch) effectively flooding the area of the mask. The coated substrate is translated under the beam (e.g. 10 to 30 inch/min). In other embodiments, the laser may be a TEA laser ($CO_2$ laser with $\lambda=9.6$ $\mu$m) producing a suitable fan beam. (The TEA laser can also be used with a narrow, focused beam, e.g. about 0.005 inch, in a scribing mode as discussed above with respect to the use of a $CO_2$ laser.)

Generally, the laser radiation is selected in combination with the masking layers. For example, it may be advantageous to select a laser wavelength and/or energy and masking layer such that the radiation does not substantially ablate the masking layer, while ablating the transparent conductive layer. A laser and masking layer may also be selected to ablate the masking and transparent conductive layers by known thicknesses per laser shot and the relative and absolute initial thickness of the layers selected to produce, after exposure, the desired thicknesses of the masking, e.g. phosphor, layer, while simultaneously completely removing the exposed portions of the transparent conductive layer. Excimer lasers are particularly preferred for the latter embodiments since the thickness of material ablated can be carefully controlled. Excimer lasers are also particularly preferred for lamps which are dynamically flexed during use, since the careful control over material removal allows for less ablation of the substrate 10 when removing the transparent conductive material.

As illustrated above, most preferably, the printed mask layer is a functional layer of the lamp, e.g. the phosphor layer. In such embodiments, the invention provides the particular advantage of eliminating the steps of forming a separate mask and does not require a separate coating step. Various functional layers may be applied as masking layers, e.g. a dielectric layer or a metal layer. In other embodiments, sacrificial layers, those provided only for the purpose of masking may also be printed, and after radiation exposure to form the lines of interruption, removed, e.g. by laser ablation with a different wavelength or further exposure at the same wavelength.

Still other embodiments are within the following claims.

We claim:

1. In an electroluminescent sheet-form lamp comprising a transparent insulation layer, a transparent first conductive layer below said transparent insulation layer forming a first electrode, a layer of phosphor material below said transparent first conductive layer, a layer of dielectric material below said phosphor layer, a second conductive layer below said dielectric layer forming a second electrode, and electrical connection means for applying an electrical potential between the conductive layers to cause the phosphor to transmit light through the transparent first conductive layer and said transparent insulation layer, one of said conductive layers having been formed as a general conductive coating preapplied over a panel of larger dimension than said lamp, from which said lamp has been cut, there being an edge region of said lamp susceptible to formation of a detrimental, electrically conductive path, the improvement wherein a main portion of said one of said conductive layers is isolated from the susceptible edge region by isolation provided along at least a portion of the perimeter of the lamp as a result of removal of said preapplied general conductive coating such that, at the region of said isolation, said main portion of said one of said conductive layers which forms the respective electrode commences at a line spaced inwardly from the outer edge of said lamp, said electrical connection for said one of said conductive layers being made to said main portion of said one of said conductive layers and being electrically isolated from said susceptible edge region, whereby a lamp formed by cutting its outline from said panel of larger dimension provides a lamp for which the formation of said conductive path in said edge region does not cause an adverse effect, and wherein said preapplied general conductive coating has been removed to form a line of interruption that leaves in place a narrow margin of conductive coating in said edge region which is electrically isolated from the main portion of the coating forming the first electrode.

2. The electroluminescent lamp of claim 1
wherein said lamp is the product of the process of exposing preselected portions of said preapplied general conductive coating to laser radiation sufficient to remove said preselected portions and form said line of interruption, making said electrical connection for said one conductive layer to said main portion of said one conductive coating in a manner so that said electrical connection is electrically isolated from said susceptible edge region, and cutting said lamp from said panel of larger dimension to provide a lamp for which the formation of said conductive path in said edge region does not cause an adverse effect.

3. The electroluminescent lamp of claim 2 formed by the process further comprising providing said laser radiation in the form of a beam of greater dimension than said preselected portions of said preapplied general conductive layer, and providing a mask between a source of said radiation and said preapplied general conductive layer, said mask having aperture regions for exposing only said preselected portions of said preapplied general conductive layer.

4. The electroluminescent lamp of claim 3 wherein said mask is a printed mask layer printed over said preapplied general conductive coating to expose only said preselected portions to be removed.

5. The electroluminescent lamp of claim 4 formed by the process further comprising selecting a laser that removes said preapplied general conductive coating without removing all of said printed mask layer, said printed mask layer adapted to serve as a functional layer of said lamp.

6. The electroluminescent lamp of claim 4 formed by the process further comprising selecting a laser that removes at least part of said printed mask layer along with said preapplied general conductive coating.

7. The lamp of claim 6 formed by the process of preselecting the thickness of said mask layer relative to the thickness of said preapplied general conductive coating to remove only some of the thickness of said mask layer while forming said region of isolation by removing all of said preapplied general conductive coating in said preselected regions, the remaining portion of said printed mask layer adapted to serve as a functional layer of said lamp.

8. The electroluminescent lamp of claim 4, 5, 6 or 7 wherein said printed mask layer is a phosphor layer applied directly to said preapplied general conductive coating.

9. The electroluminescent lamp of claim 8 wherein said printed mask layer includes said phosphor layer and at least a portion of a layer forming said electrical connection to said preapplied general conductive coating.

10. The electroluminescent lamp of claim 8 wherein said laser radiation is provided by an excimer laser.

11. The electroluminescent lamp of claim 8 wherein said laser radiation is provided by a TEA laser.

12. The electroluminescent lamp of claim 3 wherein said mask is a separate member positioned above said preapplied general conductive coating.

13. The electroluminescent lamp of claim 12 wherein said laser radiation is provided by an excimer or TEA laser.

14. The electroluminescent lamp of claim 3 wherein said beam is of fan shape, with a cross-section of elongated form, and means are employed to produce relative motion of said preapplied general conductive coating and said beam in the direction transverse to the direction of elongation of said profile.

15. The electroluminescent lamp of claim 2 wherein said laser radiation is formed by a spot beam, wherein relative motion of said preapplied coating removes said preselected portions of said preapplied general coating.

16. The electroluminescent lamp of claim 14 or 15 wherein said laser radiation is provided by a $CO_2$ or TEA laser.

17. The electroluminescent lamp of claim 14 or 15 wherein said laser radiation is provided by an excimer laser.

18. The electroluminescent lamp of claim 1 wherein said one of said conductive layers is the transparent first conductive layer forming said first electrode.

19. The electroluminescent lamp of claim 1 wherein there is an insulating substrate below said second conductive coating and said one of said conductive layers is the second conductive layer forming said second electrode, preapplied to said insulating substrate.

20. The electroluminescent lamp of claim 1 wherein said phosphor material comprises encapsulated phosphor particles and said edge region is provided as a bare edge resulting from cutting of said lamp from said larger panel.

21. The electroluminescent lamp of claim 20 wherein said lamp is mounted in a manner that exposes said bare edge region to contact by a person, said isolation preventing a shock hazard to said person.

22. The electroluminescent lamp of claim 20 wherein said lamp is mounted in a manner that allows moisture to reach the bare edge region of the lamp, said isolation preventing electrical current leak through the moisture that could lead to degradation of the lamp structure.

23. In an electroluminescent sheet-form lamp comprising a transparent substrate layer, and, in successive relationship, a transparent first conductive layer forming a first electrode, a layer of phosphor material comprising encapsulated phosphor particles, a layer of dielectric material, a second conductive layer forming a second electrode, and electrical connection means for applying an electrical potential between the conductive layers to cause the phosphor to transmit light through the transparent conductive layer and said transparent substrate, said first transparent conductive layer comprising a preapplied continuous transparent coating over said substrate, outer edges of said layers defining said lamp being exposed to the ambient environment and being susceptible to formation of a detrimental conductive path, the improvement wherein a line of interruption is provided along at least a portion of the perimeter of the lamp as a result of removal of a line of said preapplied transparent conductive coating, said line of interruption being spaced inwardly from the outer edges of said first transparent conductive layer, said line of interruption electrically isolating a main, inner portion of said first transparent layer from a margin portion of said first transparent conductive layer adjacent to the edge of the lamp, the electrical connection for said transparent conductive layer being connected to said main inner portion, said main portion serving as said first electrode and being electrically isolated from said margin portion of said first conductive layer, whereby said isolation of said main portion provides a lamp for which the formation of said conductive path in said edge region does not cause an adverse effect.

24. The lamp of claim 1 or 23 wherein said line of interruption is formed by laser scribing said preapplied conductive layer.

25. The lamp of claim 1 or 23 wherein said transparent conductive layer comprises indium tin oxide.

26. The lamp of claim 1 or 23 wherein said phosphor material is doped zinc sulfide.

27. The lamp of claim 1 or 23 wherein said substrate layer is formed of polyester.

28. The lamp of claim 1 or 23 wherein an insulation layer is provided on the back of said second conductive layer.

* * * * *